(12) United States Patent
Ohno

(10) Patent No.: US 11,509,119 B2
(45) Date of Patent: Nov. 22, 2022

(54) WAVELENGTH BEAM COMBINING SYSTEM AND METHOD FOR MANUFACTURING LASER DIODE BAR ARRAY

(71) Applicant: Panasonic Intellectual Property Management Co., Ltd., Osaka (JP)

(72) Inventor: Hiroshi Ohno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 167 days.

(21) Appl. No.: 17/126,196

(22) Filed: Dec. 18, 2020

(65) Prior Publication Data

US 2021/0234341 A1 Jul. 29, 2021

(30) Foreign Application Priority Data

Jan. 28, 2020 (JP) .............................. JP2020-012036

(51) Int. Cl.
  *H01S 5/00* (2006.01)
  *H01S 5/40* (2006.01)
  *H01S 5/14* (2006.01)
  *H01S 5/32* (2006.01)
  *H01S 5/323* (2006.01)

(52) U.S. Cl.
  CPC ............ *H01S 5/4087* (2013.01); *H01S 5/143* (2013.01); *H01S 5/4012* (2013.01); *H01S 5/4025* (2013.01); *H01S 5/4062* (2013.01); *H01S 5/14* (2013.01); *H01S 5/3202* (2013.01); *H01S 5/32341* (2013.01); *H01S 5/4075* (2013.01)

(58) Field of Classification Search
  CPC .... H01S 5/4012; H01S 5/4062; H01S 5/4087; H01S 5/4025; H01S 5/143; H01S 5/4075; H01S 5/3202; H01S 5/32341
  See application file for complete search history.

(56) References Cited

U.S. PATENT DOCUMENTS

| | | | |
|---|---|---|---|
| 2006/0165144 A1* | 7/2006 | Mikhailov | H01S 5/4062 372/50.12 |
| 2007/0064754 A1* | 3/2007 | Zheng | G02B 19/0057 372/43.01 |
| 2008/0025353 A1* | 1/2008 | Govorkov | H01S 5/02326 372/29.022 |

(Continued)

FOREIGN PATENT DOCUMENTS

| JP | 2015-106707 | 6/2015 |
|---|---|---|
| JP | 5981855 B | 8/2016 |

(Continued)

*Primary Examiner* — Kinam Park
(74) *Attorney, Agent, or Firm* — Wenderoth, Lind & Ponack, L.L.P.

(57) ABSTRACT

In a WBC system of the present disclosure, an LD bar array constituted by a plurality of LD bars is configured such that a main axis direction of an off-angle of at least one LD bar is reversed with respect to a main axis direction of an off-angle of the other LD bar. By doing so, even in the LD bar in which a wavelength distribution in a wafer exists, a difference between a designed lock wavelength and a gain peak wavelength can be kept within a range where an LD oscillation due to an external resonance is possible for all emitters in the LD bar, thereby an output in the WBC system can be maximized.

6 Claims, 13 Drawing Sheets

(56) References Cited

U.S. PATENT DOCUMENTS

| | | | |
|---|---|---|---|
| 2011/0216417 A1* | 9/2011 | Chann | G02B 19/0028 |
| | | | 359/615 |
| 2014/0240831 A1 | 8/2014 | Chann | |
| 2015/0104180 A1* | 4/2015 | Zirner | H01S 5/142 |
| | | | 398/95 |
| 2016/0161752 A1* | 6/2016 | Negoita | H01S 5/4062 |
| | | | 359/569 |
| 2018/0095285 A1 | 4/2018 | Dejima | |
| 2018/0175590 A1 | 6/2018 | Yamamoto et al. | |
| 2019/0190232 A1* | 6/2019 | Tayebati | C23F 1/18 |

FOREIGN PATENT DOCUMENTS

| | | |
|---|---|---|
| JP | 2018-061006 | 4/2018 |
| WO | 2017/022142 | 2/2017 |
| WO | 2017/033476 | 3/2017 |

* cited by examiner

WAVELENGTH BEAM COMBINING SYSTEM AND METHOD FOR MANUFACTURING LASER DIODE BAR ARRAY

BACKGROUND

1. Technical Field

The present disclosure relates to a wavelength beam combining system and a method for manufacturing a laser diode bar array used therein.

2. Description of the Related Art

A wavelength beam combining system (WBC system) is known as a system for obtaining a laser beam having high power by combining a plurality of beams having different wavelengths at one point. The WBC system is described in, for example, Japanese Patent Unexamined Publication No. 2015-106707 and the like.

The WBC system includes a laser diode bar (LD bar), a beam twister unit (beam twister lens unit (BTU)), a diffraction grating, an external resonance mirror, and the like.

The LD bar emits beams from a plurality of emitters. The plurality of beams emitted from the LD bar are individually rotated by 90 degrees by the BTU. This can prevent individual spots from interfering with each other. The beams emitted from the BTU is incident on a transmission type or a reflection type diffraction grating. The diffraction grating diffracts the incident beams at a diffraction angle determined by a wavelength thereof, and then the beams are emitted. The beams emitted from the diffraction grating is incident on the external resonance mirror. The external resonance mirror is a partially transmissive mirror that reflects a part of the incident beams perpendicular to a direction of the diffraction grating. As a result, a feedbacking between the rear mirror of the LD bar and the external resonance mirror, and an external resonance oscillation are made only for a wavelength (called a lock wavelength) that is uniquely determined by a positional relationship among the individual emitters of the LD bar, the diffraction grating, and the external resonance mirror, thereby a laser beam is output.

Since each of the individual emitters of the LD bar has different relative position from the diffraction grating, the external resonance oscillation is made at slightly different wavelengths, but since it is combined to one point by the external resonance mirror, it is possible to output a laser beam having high power.

SUMMARY

According to an aspect of the present disclosure, there is provided a wavelength beam combining system that combines a plurality of beams with different wavelengths at one point, the system including: a laser diode bar array in which a plurality of laser diode bars having a plurality of emitters are arranged; a diffraction grating that diffracts a plurality of beams emitted from the laser diode bar array; and an external resonance mirror that feeds a part of the beams diffracted by the diffraction grating back into the laser diode bar array to make the part of the beams externally resonate, and in which in the laser diode bar array, a main axis direction of an off-angle of at least one laser diode bar is reversed with respect to a main axis direction of an off-angle of another laser diode bar among the plurality of laser diode bars.

According to another aspect of the present disclosure, there is provided a method for manufacturing a laser diode bar array used in a wavelength beam combining system, the method including: forming a semiconductor laser lamination structure including a light emitting layer on a wafer; forming an emitter portion, a P-side electrode, and an N-side electrode on the wafer; cutting out a plurality of multi-emitter laser diode bars from the wafer; and creating a laser diode bar array by combining the plurality of multi-emitter laser diode bars in which the laser diode bar array is created by reversing a main axis of an off-angle of at least one or more multi-emitter laser diode bars.

DETAILED DESCRIPTIONS

In a WBC system, when a difference between a gain peak wavelength (that is, it is an oscillation wavelength of the LD bar due to a configuration of the LD bar itself, and can also be called an amplified spontaneous emission (ASE) wavelength) of an LD bar and a lock wavelength due to external resonance becomes large, a beam cannot oscillate.

When the external resonance oscillation can be made by only some of a plurality of emitters in the LD bar, the WBC system becomes an inefficient system.

The present disclosure has been made in consideration of the above points and provides a wavelength beam combining system with improved oscillation performance and a method for manufacturing a laser diode bar array capable of improving the oscillation performance of the wavelength beam combining system.

Hereinafter, exemplary embodiments of the present disclosure will be described with reference to the drawings.

<1> Principle of Oscillation in Wavelength Beam Combining System

First, before explaining the exemplary embodiments of the present disclosure, the background to the present disclosure will be described.

Figure 1:
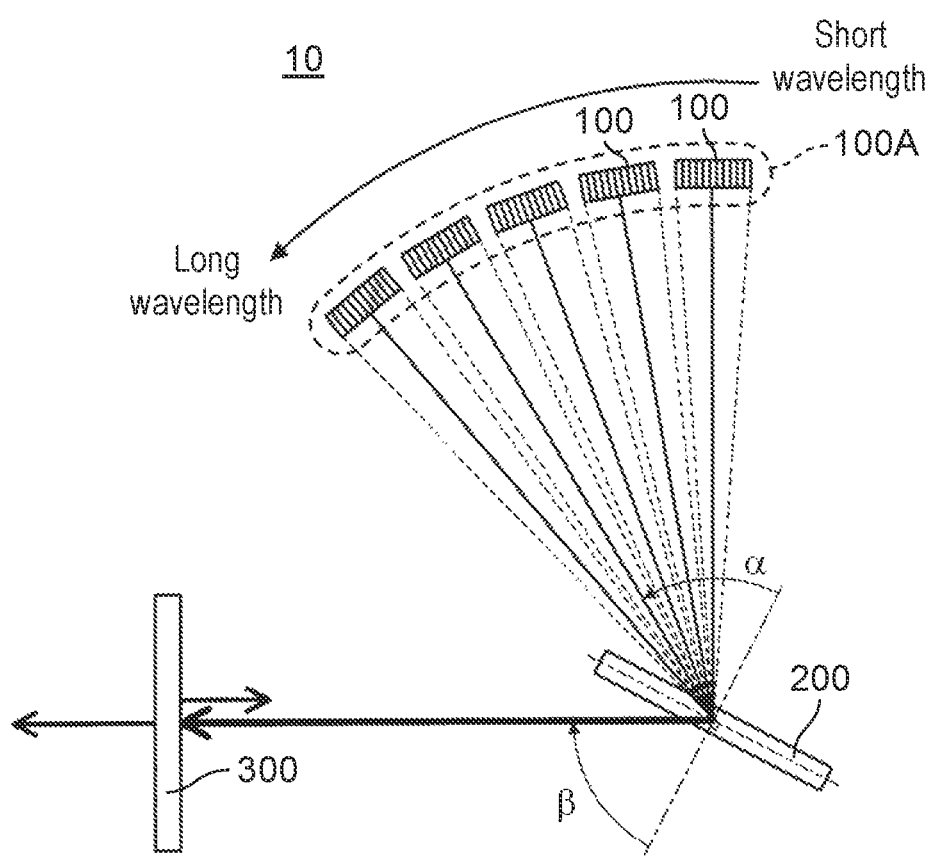
FIG. 1 is a schematic view of a WBC system.

FIG. 1 is a schematic view of WBC system 10. Of course, the actual WBC system includes configuration elements other than those illustrated in FIG. 1, but the configuration elements are omitted.

WBC system 10 includes laser diode bar array (LD bar array) 100A constituted by a plurality of LD bars 100, transmission type diffraction grating 200, and external resonance mirror 300. Actually, an optical system such as a BTU (not illustrated) is provided between LD bar 100 and diffraction grating 200. The laser diode bar array is constituted by the plurality of LD bars 100.

Figure 2:
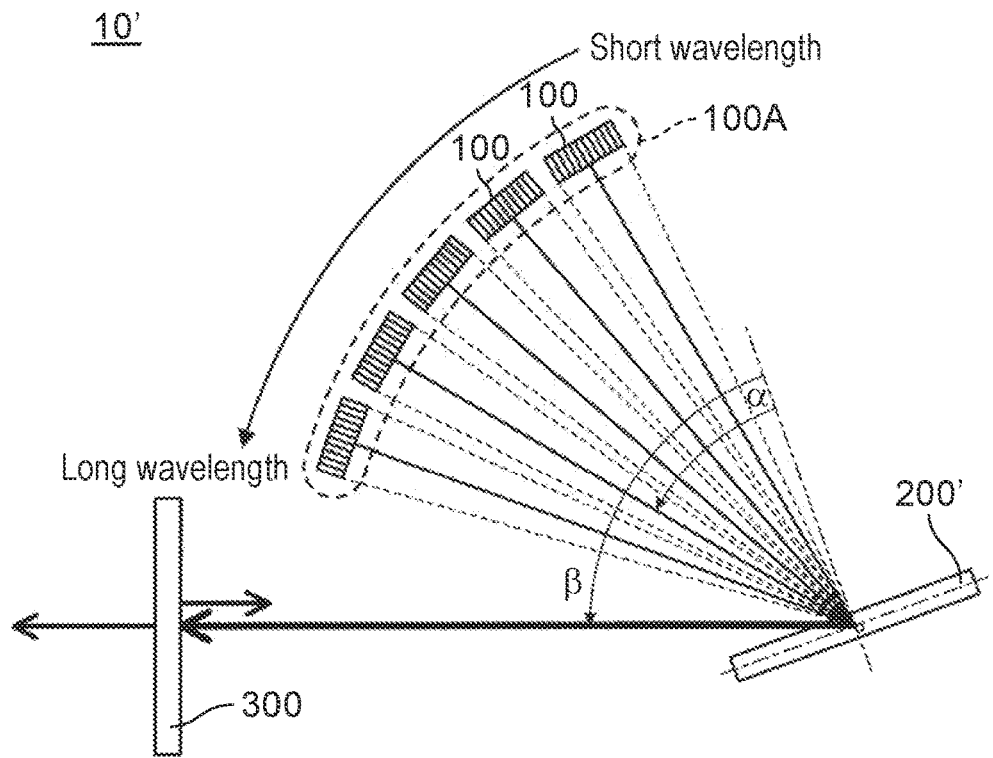
FIG. 2 is a schematic view of the WBC system (in the case of a reflective type diffraction grating)

Although transmission type diffraction grating 200 is used in the present Exemplary Embodiment, the technique of the present disclosure can also be applied to WBC system 10' using reflection type diffraction grating 200' as illustrated in FIG. 2.

Figure 3:
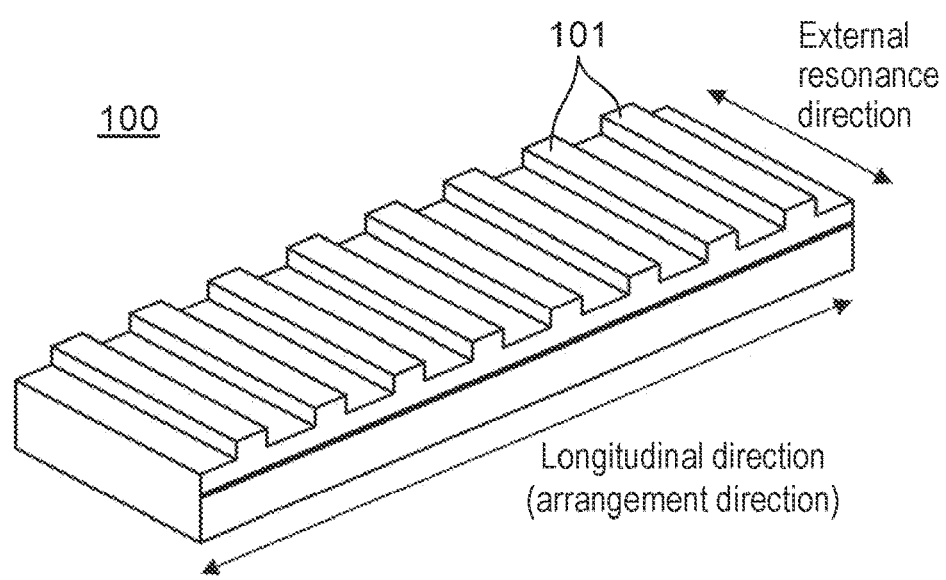
FIG. 3 is a perspective view illustrating a configuration of one LD bar.

FIG. 3 illustrates a configuration of one LD bar 100. LD bar 100 includes injection regions (which may be referred to as electrodes) 101 of a plurality of emitters formed at intervals from each other. Injection regions 101 are arranged in a stripe shape along the longitudinal direction of LD bar 100. By supplying a voltage in parallel to all injection regions 101 in LD bar 100 from a power supplier (not illustrated), a laser beam is simultaneously emitted from a laser element corresponding to each injection region 101 in an external resonance direction.

In FIG. 3, a laser structure having a projection portion stripe shaped current injection region that is called a ridge stripe is illustrated, but other laser structures may be used.

It will be described back to FIG. 1. WBC system 10 has the following features.

Of the beams emitted from each emitter of LD bar 100, by returning only a wavelength, which satisfies a diffraction condition of diffraction grating 200 and is vertically reflected by external resonance mirror 300, to an original emitter portion, external resonance can be generated and laser oscillation can be performed.

An oscillation wavelength of each LD bar 100 and each emitter corresponding to injection region 101 is uniquely determined by the dispositions of diffraction grating 200 and LD bar 100. This wavelength is called a lock wavelength.

When a difference between a gain peak wavelength of LD bar 100 (that is, an oscillation wavelength of LD bar 100 due to a configuration of LD bar 100 itself) and a lock wavelength due to external resonance becomes large, a beam cannot oscillate.

In diffraction grating 200, assuming that a period of the diffraction grating is d, an incident angle is α, an output angle is β, a wavelength is λ, and a degree is m, a diffraction condition of diffraction grating 200 can be expressed by the following equation.

$$d(\sin \alpha + \sin \beta) = m\lambda \qquad \text{Equation (1)}$$

It is common to select a diffraction grating disposition in which the actually effective degree is only m=1.

Figure 4:
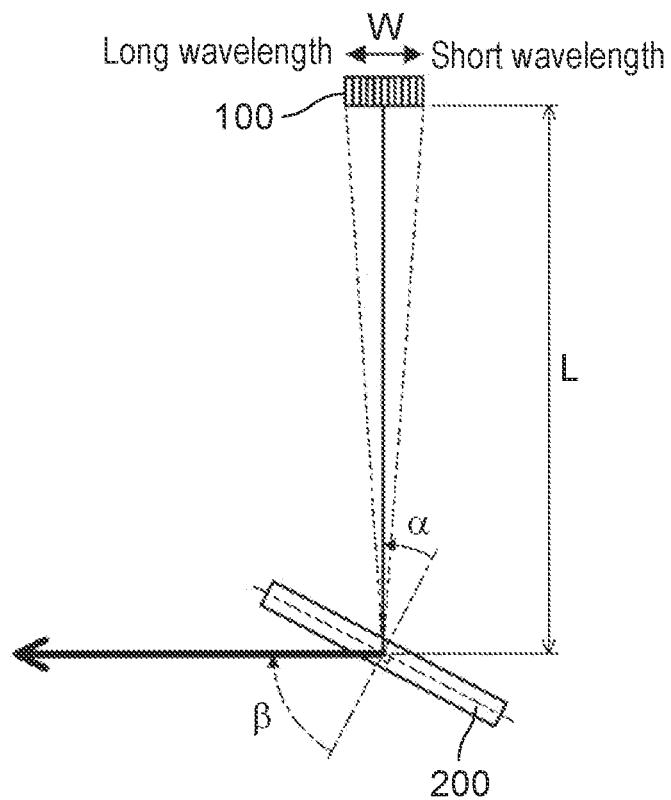
FIG. 4 is a view illustrating a relationship between the one LD bar and a diffraction grating.
Figure 5:
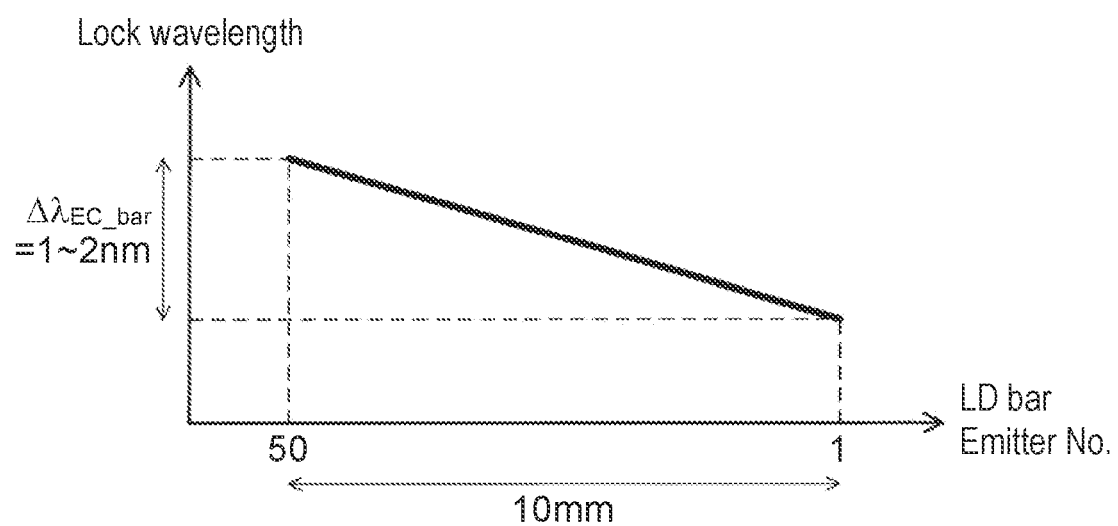
FIG. 5 is a view illustrating an example of a lock length of the WBC system with respect to each emitter in one LD bar.

FIG. 4 is a view illustrating a relationship between one LD bar 100 and diffraction grating 200. FIG. 5 is a view illustrating an example of a lock length of WBC system 10 with respect to each emitter in one LD bar 100. In the example illustrated in the figure, an example in which 50 emitters are formed in one LD bar 100, and the length from the first emitter to the 50th emitter (length W of LD bar 100 in FIG. 4) is 10 [mm] is illustrated.

Length W of LD bar 100 is 10 [mm] when light having a wavelength of substantially 400 to 500 nm is set so that the output angle β is 45[°] using the diffraction grating with a groove period of 3000 lines/mm (d=0.333[μm]), and a difference $\Delta\lambda_{EC\_bar}$ between the lock wavelengths of the emitters at both ends of LD bar 100 is calculated to be substantially 1.0 [nm] when distance L from LD bar 100 to the diffraction grating is 2.6 [m]. Similarly, a difference $\Delta\lambda_{EC\_bar}$ between the lock wavelengths of the emitters at both ends of LD bar 100 is substantially 2.0 [nm] when length W of LD bar 100 is 10 [mm] and distance L from LD bar 100 to the diffraction grating is 1.3 [m].

In this way, although there is a difference in the amount of change in the lock wavelength depending on the disposition of WBC system 10 and the design of the component, the lock wavelength of each emitter in LD bar 100 certainly changes little by little in principle, and the amount of change is 1 to 2 [nm] in the bar of 10 [mm].

Figure 6:
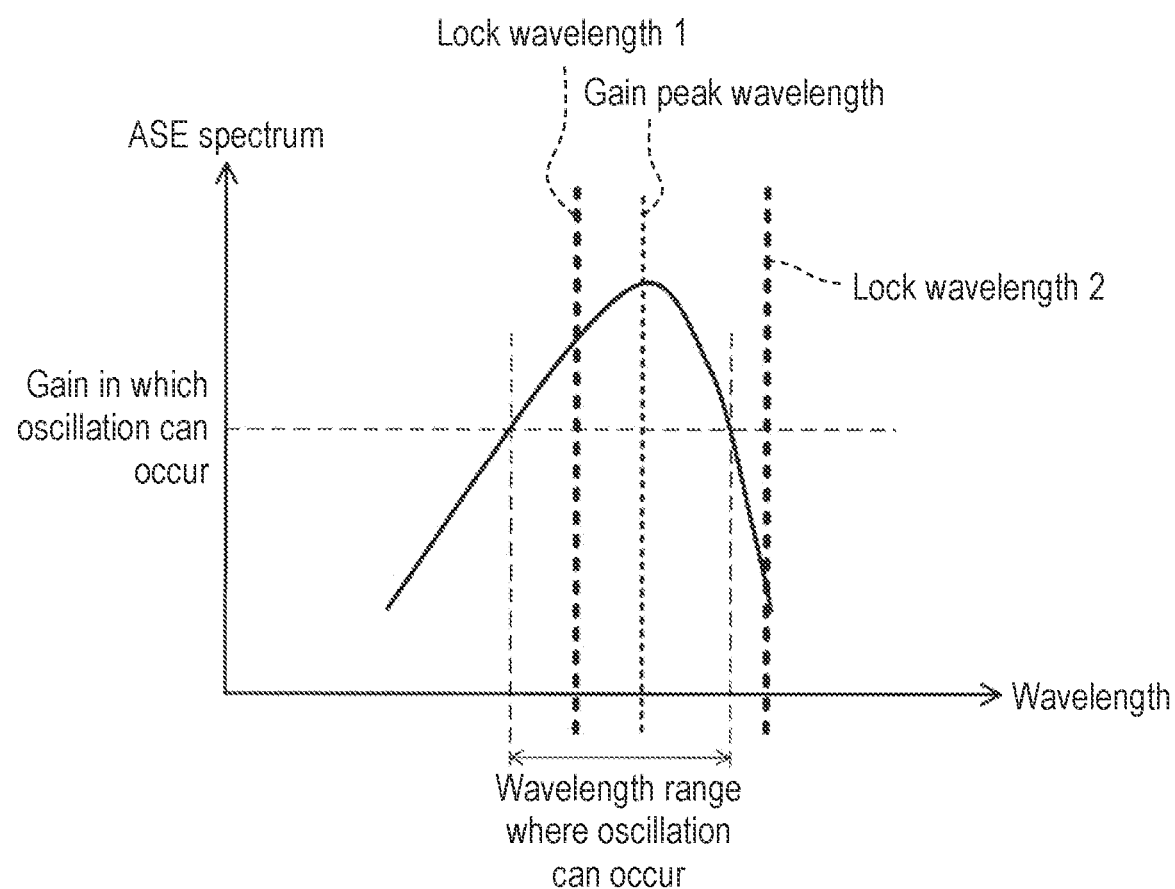
FIG. 6 is a view illustrating a range of a wavelength at which the LD bar can oscillate.

FIG. 6 is a view illustrating a range of a wavelength at which LD bar 100 can oscillate. The curve in the figure illustrates a wavelength dependency of a gain of LD bar 100 it is referred to as a gain spectrum or an ASE spectrum). LD bar 100 can oscillate only at a wavelength whose gain is equal to or higher than a predetermined value. In other words, from a gain peak wavelength of LD bar 100, a lock wavelength within a predetermined range oscillates, and a lock wavelength out of the predetermined range does not oscillate. In the example of the figure, lock wavelength 1 oscillates because it is within a range that the wavelength can oscillate, but lock wavelength 2 does not oscillate because it is out of the range that the wavelength can oscillate.

Figure 7:
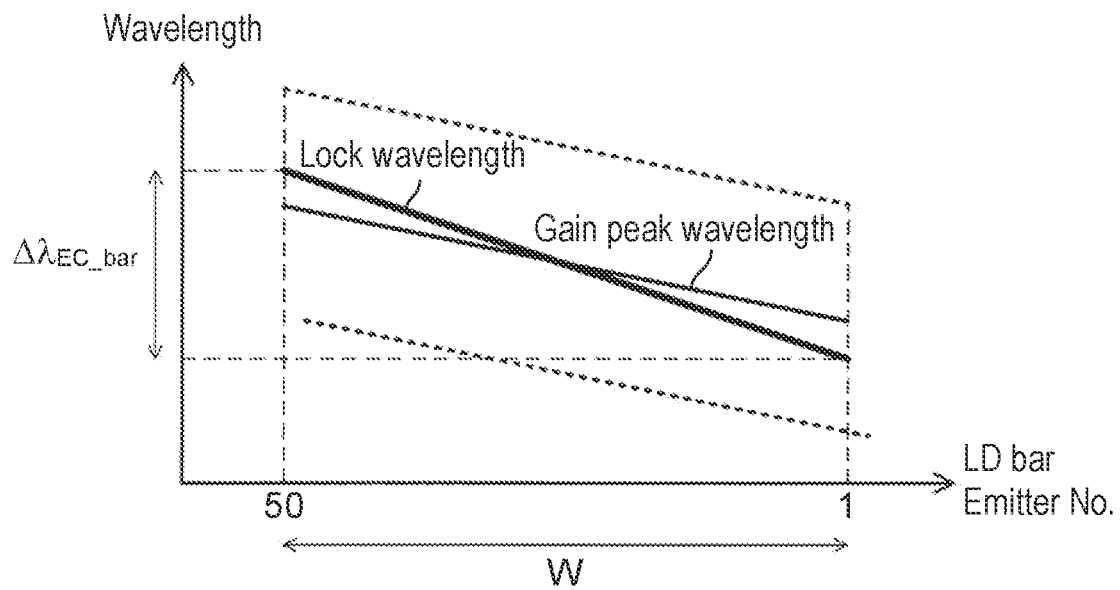
FIG. 7 is a view illustrating a relationship between a gain peak wavelength of each emitter of the LD bar and a lock wavelength by the WBC system.
Figure 8:
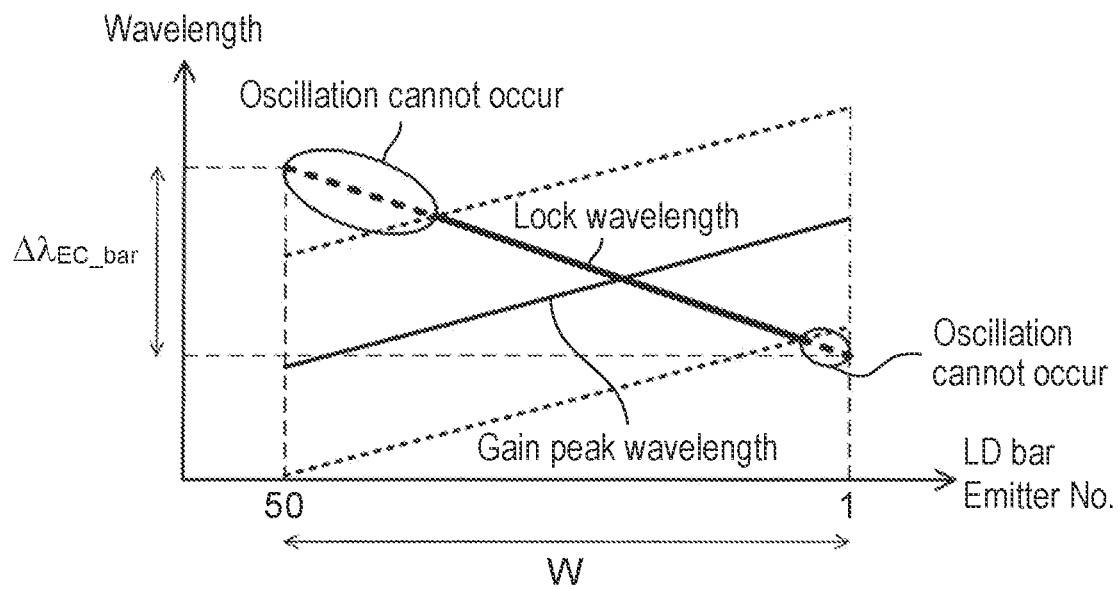
FIG. 8 is a view illustrating a relationship between a gain peak wavelength of each emitter of the LD bar and a lock wavelength by the WBC system.

FIGS. 7 and 8 are views illustrating a relationship between a gain peak wavelength (it may be called an ASE wavelength) of each emitter of LD bar 100 and a lock wavelength by WBC system 10. As described above, the lock wavelength has an inclination corresponding to a change in an incident angle on diffraction grating 200.

As in the example in FIG. 7, it is a case where the distribution of the gain peak wavelength of the emitter in LD bar 100 is in the same direction as the positive/negative of the inclination of the lock wavelength, and since the difference between the gain peak wavelength and the lock wavelength is within the predetermined range for all the emitters, all the emitters can oscillate.

In contrast to this, as in the example in FIG. 8, it is a case where the distribution of the gain peak wavelength of the emitter in LD bar 100 is in a direction different from the positive/negative of the inclination of the lock wavelength, and since the difference between the gain peak wavelength and the lock wavelength is out of the predetermined range for some of the emitters, some of the emitters cannot oscillate.

The present disclosure presents configurations and methods capable of reducing such an emitter that cannot oscillate.

<2> Exemplary Embodiment 1

In the manufacturing of LD bar 100, first, a semiconductor laser lamination structure including a light emitting layer is formed on one wafer by epitaxial growth, after that, a ridge stripe structure is formed on the wafer as an emitter portion, and a P-side electrode and an N-side electrode are formed. Next, a plurality of multi-emitter laser diode bars (that is, LD bar 100) are cut out to form a high reflection coating film on a rear end surface of the LD bar and an anti-reflection coating film on a front end surface of the LD bar. Further, by combining the plurality of cut out LD bars 100, a laser diode bar array used in WBC system 10 is manufactured.

By the way, the wavelength distribution in the wafer has various characteristic distributions depending on an equipment condition or an epitaxial growth condition (for example, a concentric circle shape or the like). In a case where LD bar array 100A is created, when the wavelength distribution in the wafer is taken into consideration, the LD bars having similar inclinations of the wavelength distribution can be combined. At this time, by reversing and disposing the front and rear of the LD bar according to the wavelength distribution, the wavelength distribution in the LD bar can be aligned between the LD bars.

In the present Exemplary Embodiment, a GaN board is used as a wafer. When a semiconductor laser having a wavelength bandwidth with a wavelength of 350 nm or more and 550 nm or less is manufactured, a GaN board is generally used as a base material wafer.

Normally, the GaN board has an off-angle distribution in a surface, but since it is common to incline a constant off-angle (0.3 to 0.7°) with respect to a certain axis, a main axis inside the surface of the board in the off-direction is uniquely determined, and in general, the main axis direction of the off-angle is the ±m-axis direction or the ±a-axis direction. Further, when an LD bar having the same performance is manufactured, it is common to use a GaN board having the same specifications. Therefore, when the disposition of some LD bars is reversed and disposed as described above in order to make the wavelength distribution aligned, LD bar array 100A includes the LD bar in which the main axis direction of the off-axis is reversed.

This will be described in detail with reference to FIG. 9.

Figure 9C:
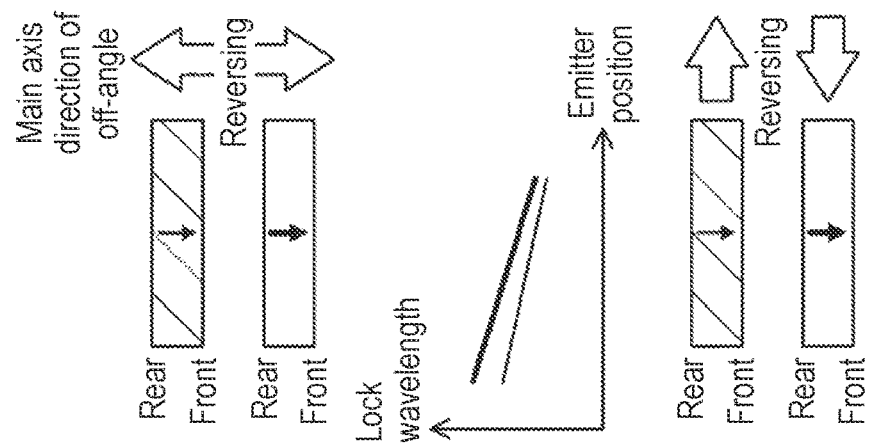
FIG. 9C is a view used for explaining Exemplary Embodiment 1, and is a view used for explaining a reversal of the LD bar and an effect thereof.
Figure 9B:
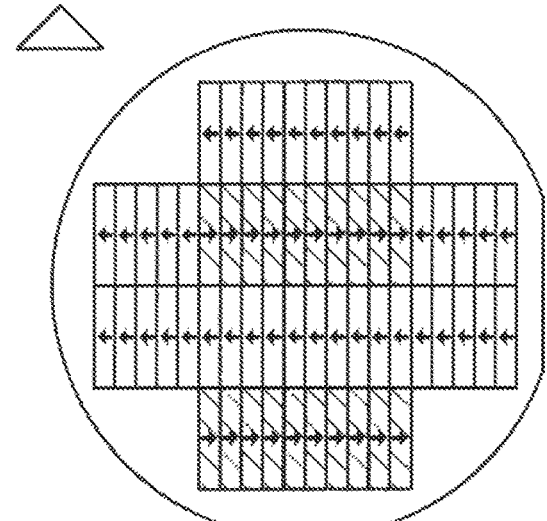
FIG. 9B is a view used for explaining Exemplary Embodiment 1, and is a view illustrating a wavelength distribution of the LD bar inside the board.
Figure 9A:
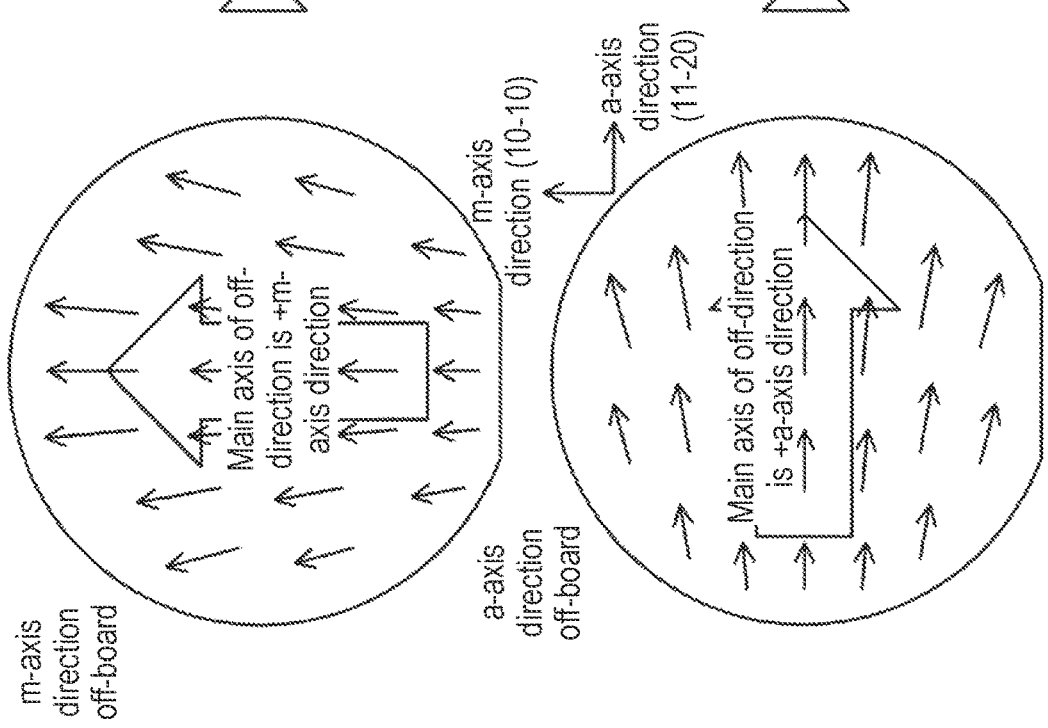
FIG. 9A is a view used for explaining Exemplary Embodiment 1, and is a view illustrating a state of an m-axis direction off-board and an a-axis direction off-board in an off-direction.

FIG. 9A is a view illustrating a state of an maxis direction off-board and an a-axis direction off-board in the off-direction. It can be seen that the main axis of the maxis direction off-board in the off-direction is the +m-axis direction, and the main axis of the a-axis direction off-board in the off-direction is the +a-axis direction.

FIG. 9B is a view illustrating a wavelength distribution of the LD bar inside the board (wafer). The LD bar indicated by the up arrow (↑) in the figure is an LD bar in which the gain peak wavelength in the LD bar decreases from a left end toward a right end (that is, the inclination is negative), and the LD bar indicated by the down arrow (↓) in the figure is an LD bar in which the gain peak wavelength in the LD bar increases from the left end toward the right end (that is, the inclination is positive).

When such LD bars having the positive/negative of the inclinations opposite to each other are mixed in one LD bar array 100A, there is a high possibility that an emitter that does not oscillate is generated.

Therefore, in the present Exemplary Embodiment, as illustrated in FIG. 9C, by reversing some LD bars 180° in the wafer plane, the positive/negative of the inclination of increase/decrease in the gain peak wavelengths of the plurality of LD bars 100 constituting LD bar array 100A are matched (see the middle part graph in FIG. 9C). At this time, for the LD bar cut out from the maxis direction off-board, the main axis of the off-angle is reversed in the vertical direction as illustrated in the upper part in FIG. 9C, and for the LD bar cut out from the a-axis direction off-board, the main axis of the off-angle is reversed in the horizontal direction as illustrated in the lower part in FIG. 9C.

That is, in WBC system 10 of the present Exemplary Embodiment, LD bar array 100A constituted by the plurality of LD bars 100 is configured such that the main axis direction of the off-angle of at least one LD bar 100 is reversed with respect to the main axis direction of the off-angle of the other LD bar 100.

By doing so, even in the LD bar in which a wavelength distribution in a wafer exists, a difference between a designed lock wavelength and a gain peak wavelength can be kept within a range where an LD oscillation due to an external resonance is possible for all emitters in the LD bar, thereby an output in the WBC system can be maximized.

<3> Exemplary Embodiment 2

When the length of LD bar 100 is constant in the system, regardless of the length of LD bar 100, it is possible to define whether or not the external resonance oscillation can be made in the entire LD bar from a magnitude relationship of the change in wavelength (lock wavelength, ASE wavelength) in LD bar 100.

Further, by using a relationship between the inclination of increase/decrease in the lock wavelength and the direction of the inclination of increase/decrease in the ASE peak wavelength in the LD bar, it is possible to specify conditions in which the external resonance oscillation can be made for all the emitters in the LD bar. In the present Exemplary Embodiment, such conditions are proposed. In the present Exemplary Embodiment, three patterns of conditions are proposed.

<3-1> Condition 1

Figure 10:
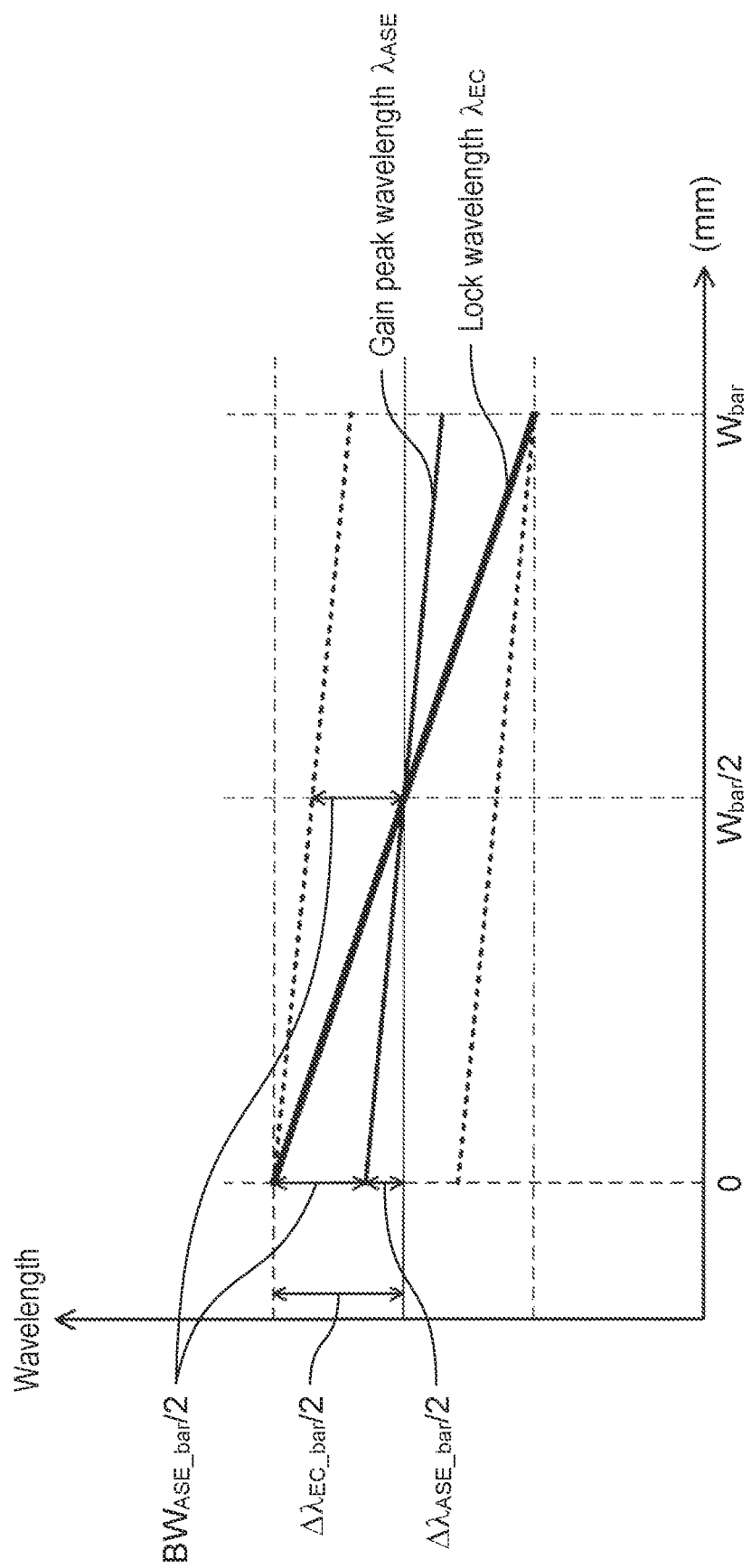
FIG. 10 is a graph for explaining condition 1 of Exemplary Embodiment 2.

FIG. 10 is a graph for explaining condition 1.

In an emitter arrangement direction in LD bar 100, positive/negative of an inclination of increase/decrease in a lock wavelength, and positive/negative of an inclination of increase/decrease in an amplified spontaneous emission (ASE) wavelength are in the same direction, an absolute value of the inclination of increase/decrease in the ASE wavelength is smaller than an absolute value of the inclination of increase/decrease in the lock wavelength, and the following equation is established.

$$|\Delta\lambda_{EC\_bar}| - |\Delta\lambda_{ASE\_bar}| \leq BW_{ASE\_bar} \qquad \text{Equation (2)}$$

Where, $\Delta\lambda_{EC\_bar}$ is an amount of change in the lock wavelength in LD bar 100, $\Delta\lambda_{ASE\_bar}$ is an amount of change in the ASE peak wavelength in LD bar 100, and $BW_{ASE\_bar}$ is an average value or a median value of ASE bandwidths of each of the emitters in LD bar 100. The parameters used here will be described in detail later.

By doing so, the external resonance oscillation can be made for all the emitters in the LD bar.

<3-2> Condition 2

Figure 11:
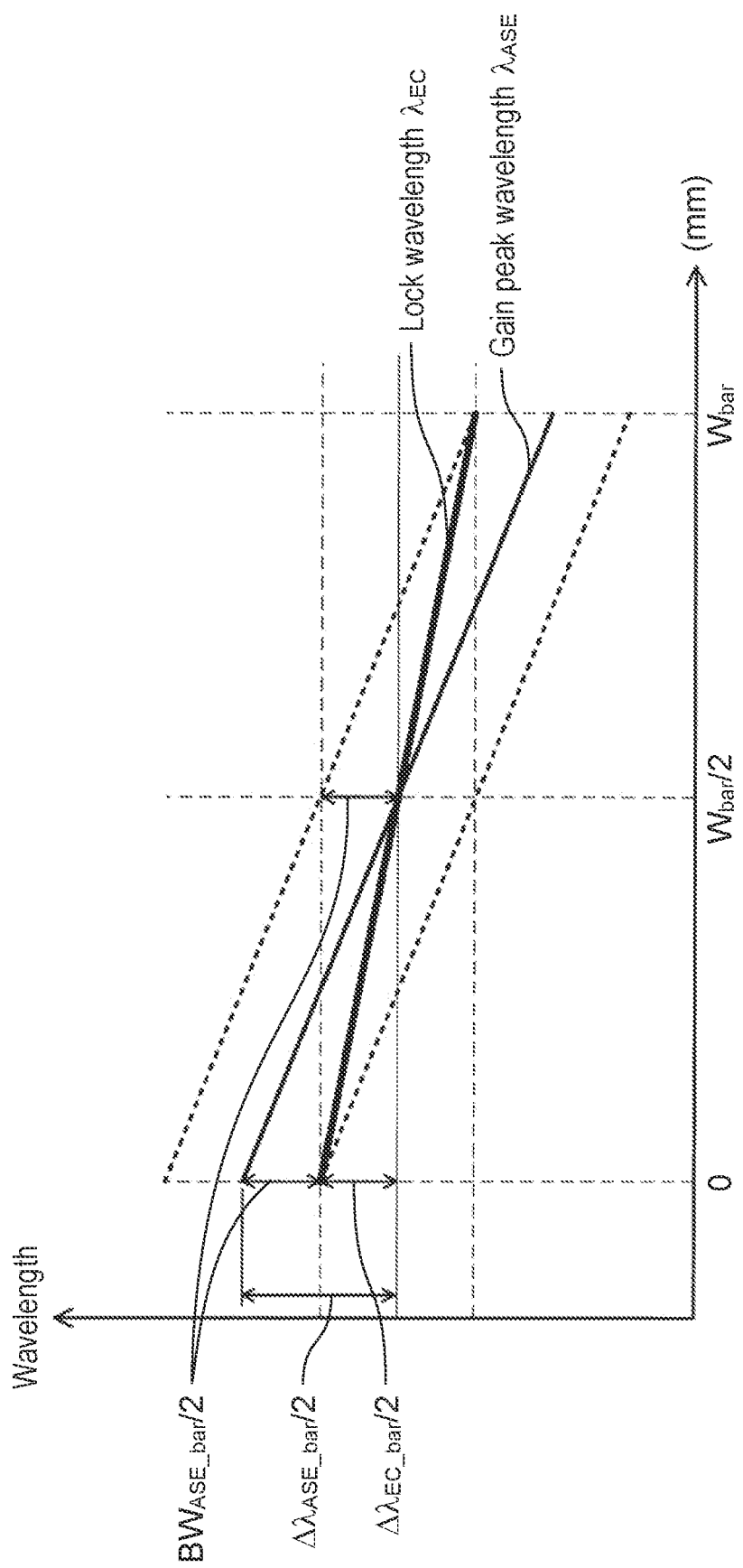
FIG. 11 is a graph for explaining condition 2 of Exemplary Embodiment 2.

FIG. 11 is a graph for explaining condition 2.

In an emitter arrangement direction in LD bar 100, positive/negative of an inclination of increase/decrease in a lock wavelength, and positive/negative of an inclination of increase/decrease in an amplified spontaneous emission (ASE) wavelength are in the same direction, an absolute value of the inclination of increase/decrease in the lock wavelength is smaller than an absolute value of the inclination of increase/decrease in the ASE wavelength, and the following equation is established.

$$|\Delta\lambda_{ASE\_bar}| - |\Delta\lambda_{EC\_bar}| \leq BW_{ASE\_bar} \qquad \text{Equation (3)}$$

Where, $\Delta\lambda_{ASE\_bar}$ is an amount of change in the ASE peak wavelength in LD bar 100, $\Delta\lambda_{EC\_bar}$ is an amount of change in the lock wavelength in LD bar 100, and $BW_{ASE\_bar}$ is an average value or a median value of ASE bandwidths of each of the emitters in LD bar 100.

By doing so, the external resonance oscillation can be made for all the emitters in the LD bar.

<3-3> Condition 3

Figure 12:
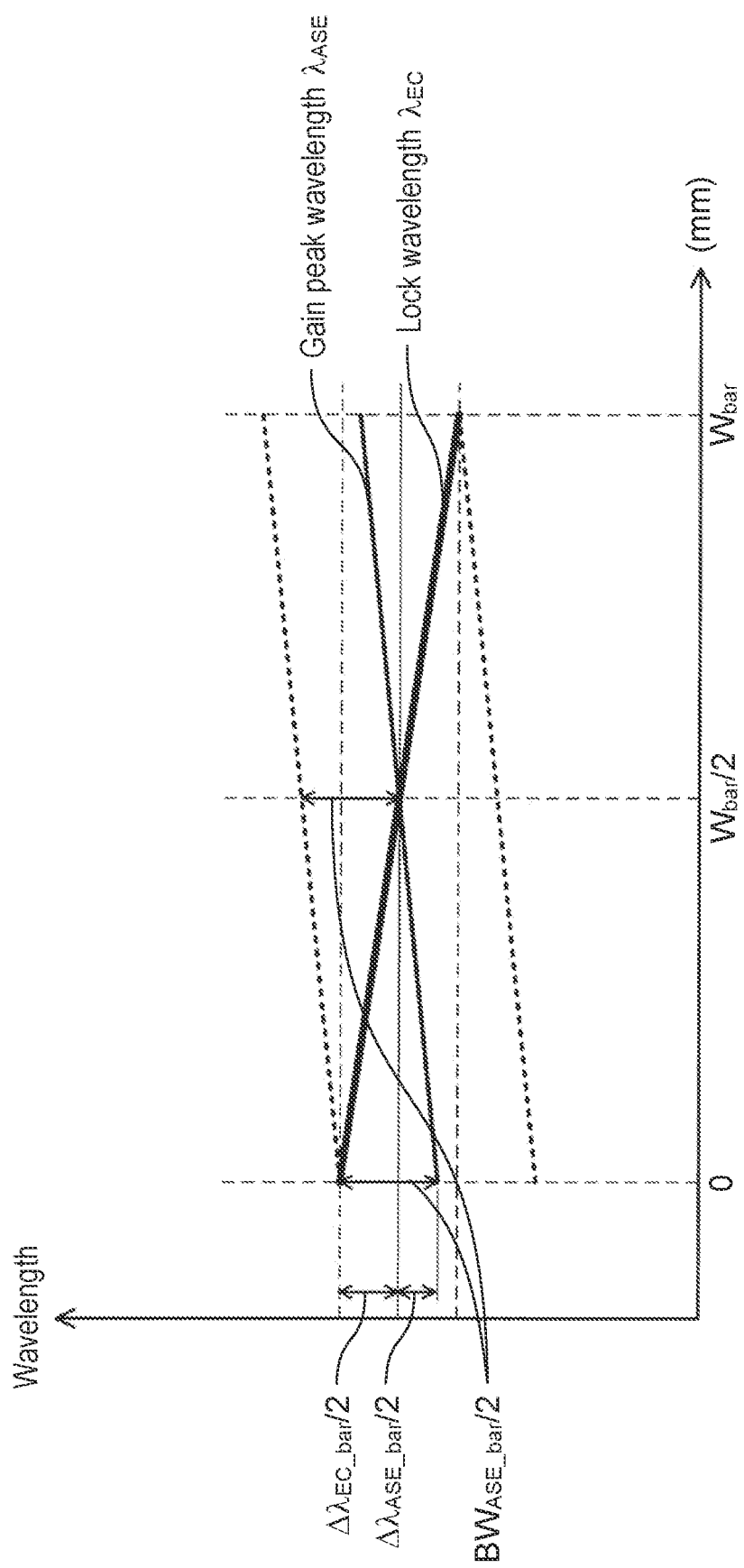
FIG. 12 is a graph for explaining condition 3 of Exemplary Embodiment 2.

FIG. 12 is a graph for explaining condition 3.

In an emitter arrangement direction in LD bar 100, positive/negative of an inclination of increase/decrease in a lock wavelength, and positive/negative of an inclination of increase/decrease of an amplified spontaneous emission (ASE) wavelength are in opposite directions, and the following equation is established.

$$|\Delta\lambda_{EC\_bar}| + \Delta\lambda_{ASE\_bar}| \leq BW_{ASE\_bar} \qquad \text{Equation (4)}$$

Where, $\Delta\lambda_{EC\_bar}$ is an amount of change in the lock wavelength in LD bar 100, $\Delta\lambda_{ASE\_bar}$ is an amount of change in the ASE peak wavelength in LD bar 100, and $BW_{ASE\_bar}$ is an average value or a median value of ASE bandwidths of each of the emitters in LD bar 100.

<3-4> Comparative Example

Figure 13:
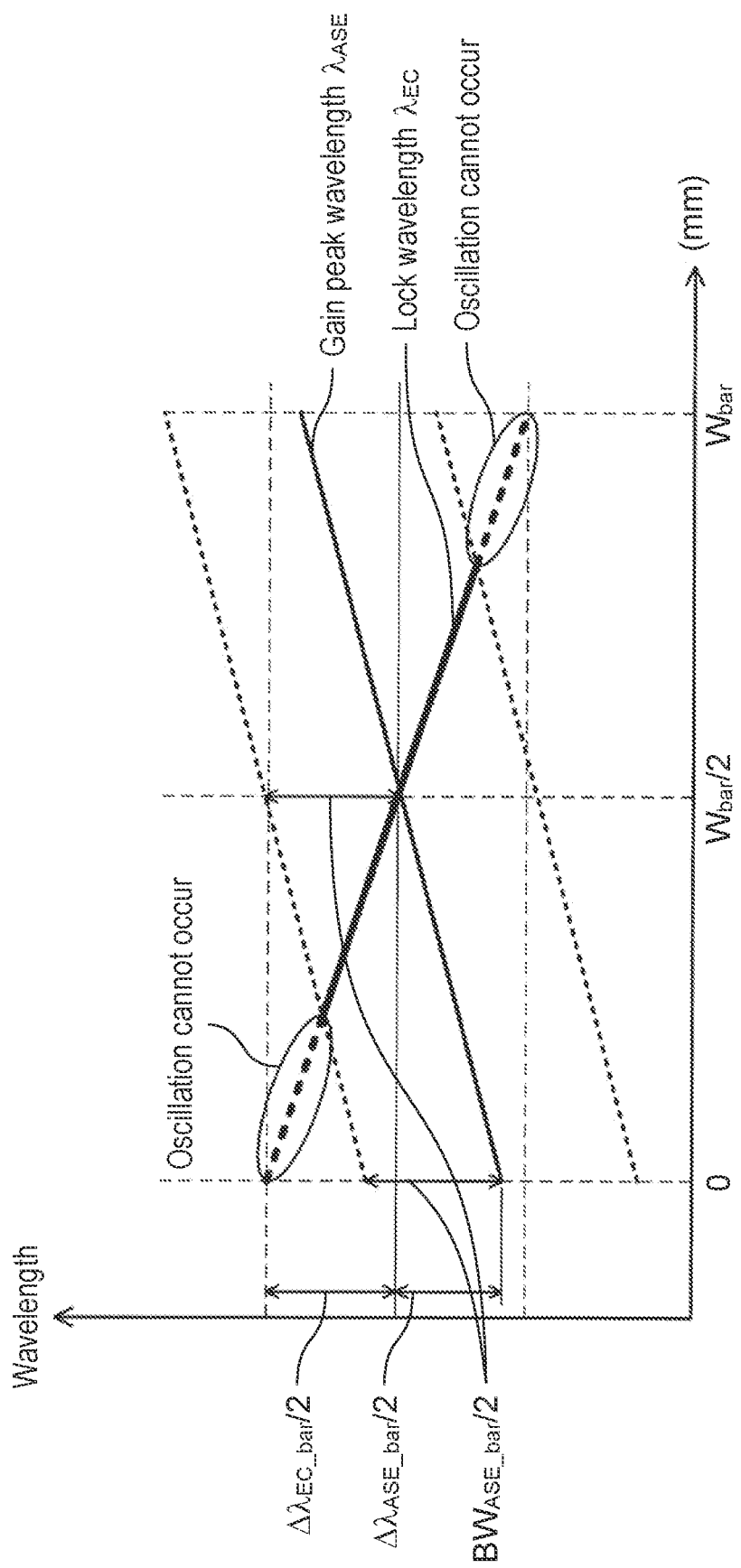
FIG. 13 is a graph for explaining a comparative example.

FIG. 13 is a graph illustrating an example in which an oscillation efficiency of some emitters is reduced (that is, oscillation can not be made) as a comparative example with respect to the present Exemplary Embodiment.

<3-5> Supplement

Figure 14:
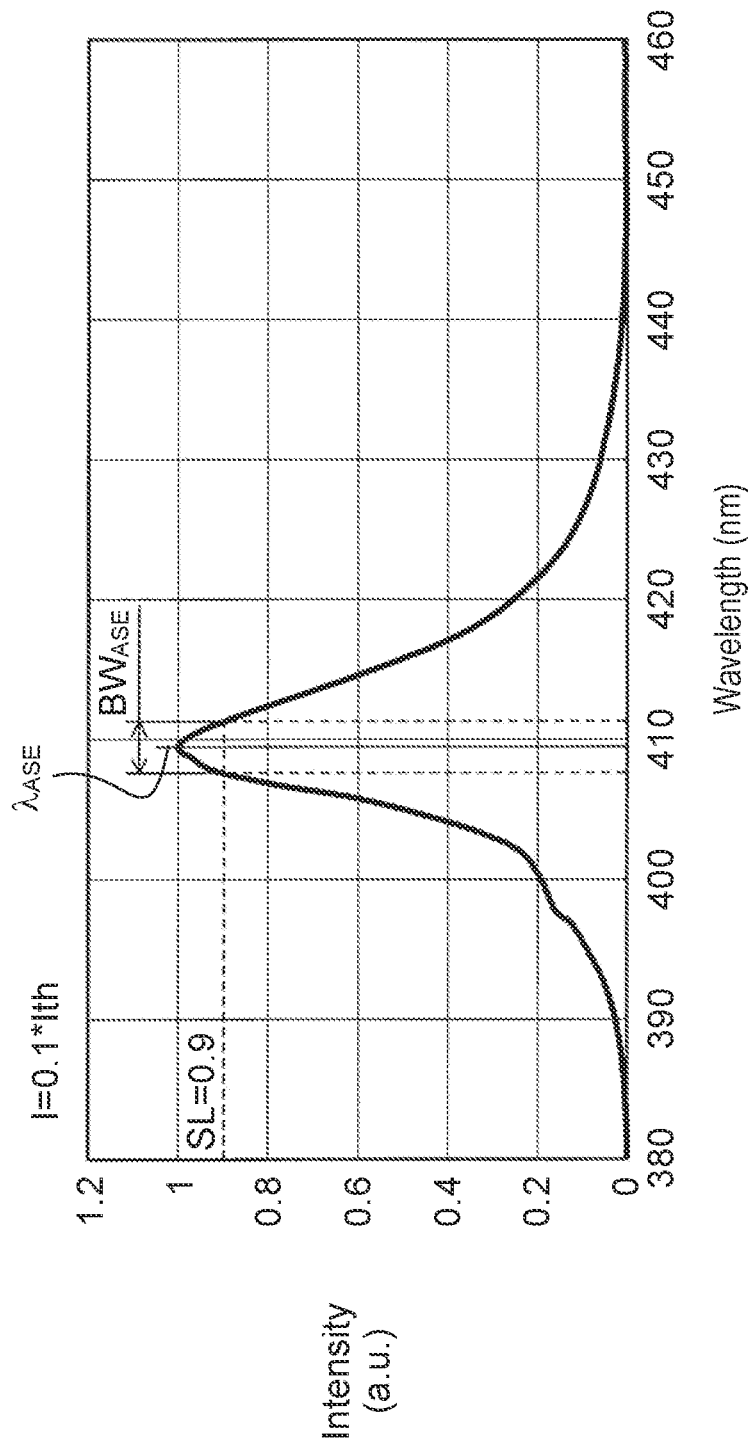
FIG. 14 is a view illustrating an example of an ASE spectrum.
Figure 15:
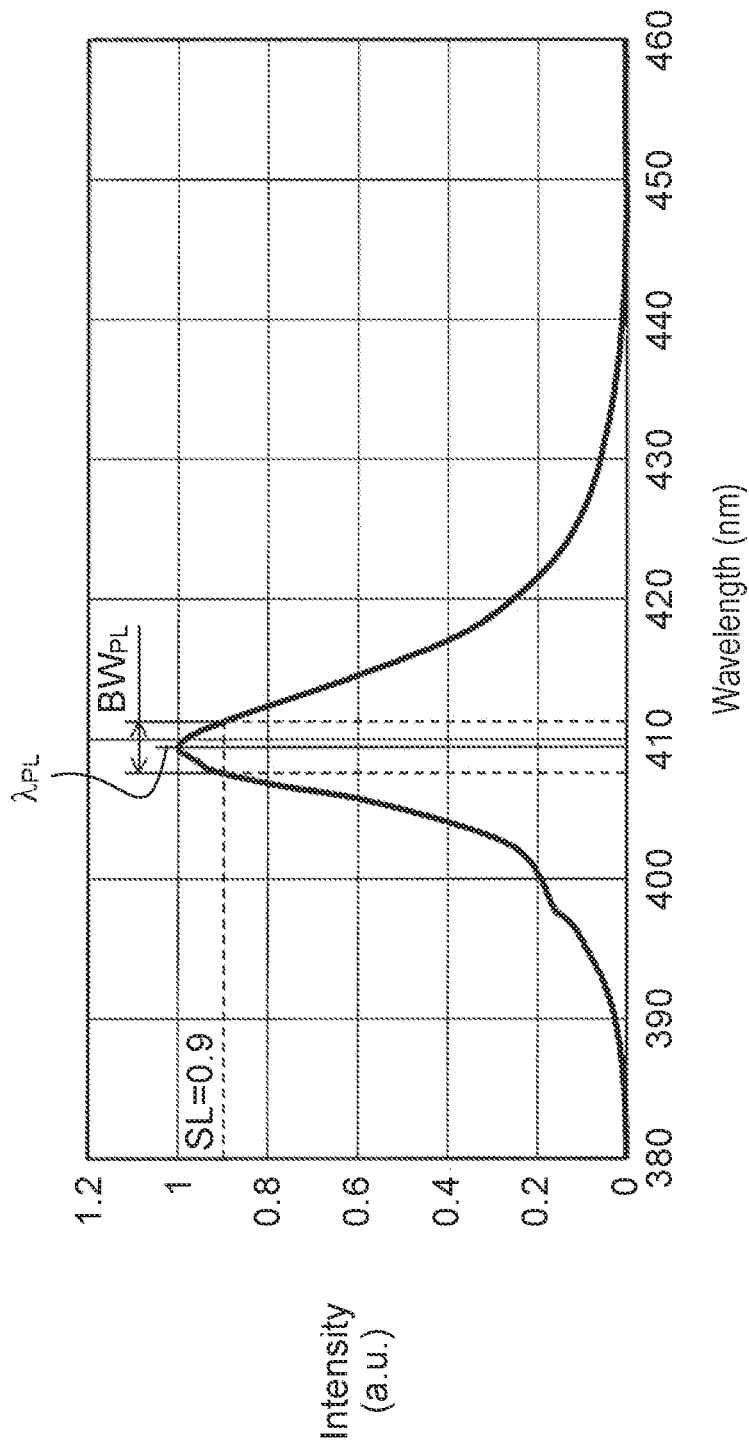
FIG. 15 is a view illustrating an example of a PL spectrum.

The parameters and the like used in the present Exemplary Embodiment will be supplemented with reference to FIGS. 14 and 15.

FIG. 14 illustrates an example of an ASE spectrum. The ASE spectrum is defined as an EL spectrum before oscillation of the LD bar (Electro-Luminescence, current injection light emitting spectrum), and in the present disclosure, it is defined as the EL spectrum when an injection current value $I=0.1 \times I_{th}$. $I_{th}$ is a threshold value current of an internal resonance oscillation of the LD bar. $\lambda_{ASE}$ is a peak wavelength of the ASE spectrum. $\Delta\lambda_{ASE\_bar}$ is an amount of change in the ASE peak wavelength (right end–left end) in the LD bar. $BW_{ASE}$ is a bandwidth defined at slice level SL=0.9 with reference to a peak intensity of the ASE spectrum. $BW_{ASE\_bar}$ is an average value (or median value) of an ASE bandwidth of each emitter in the LD bar. $K_{ASE\_bar}$ is $\Delta\lambda_{ASE\_bar}/W_{bar}$, which is an inclination of the ASE peak wavelength in the LD bar ($W_{bar}$ is the length of the LD bar).

FIG. 15 illustrates an example of a PL spectrum. The PL spectrum can be defined as a PL spectrum (Photoluminescence, photo excited light emitting spectrum) of the LD bar. $\lambda_{PL}$ is a peak wavelength of the PL spectrum. $\Delta\lambda_{PL\_bar}$ is an amount of change in the PL peak wavelength (right end–left end) in the LD bar. $BW_{PL}$ is a bandwidth defined at a slice level of 0.9 with reference to a peak intensity of the PL spectrum. $BW_{PL\_bar}$ is an average value (or median value) of a PL bandwidth of each emitter in the LD bar. $K_{PL\_bar}$ is $\Delta\lambda_{PL\_bar}/W_{bar}$, which is an inclination of the PL peak wavelength in the LD bar ($W_{bar}$ is the length of the LD bar). The BW of the PL spectrum under a weak excitation condition can be substituted for the BW of the ASE spectrum (the peak wavelength changes, but the BW is substantially the same).

Figure 16:
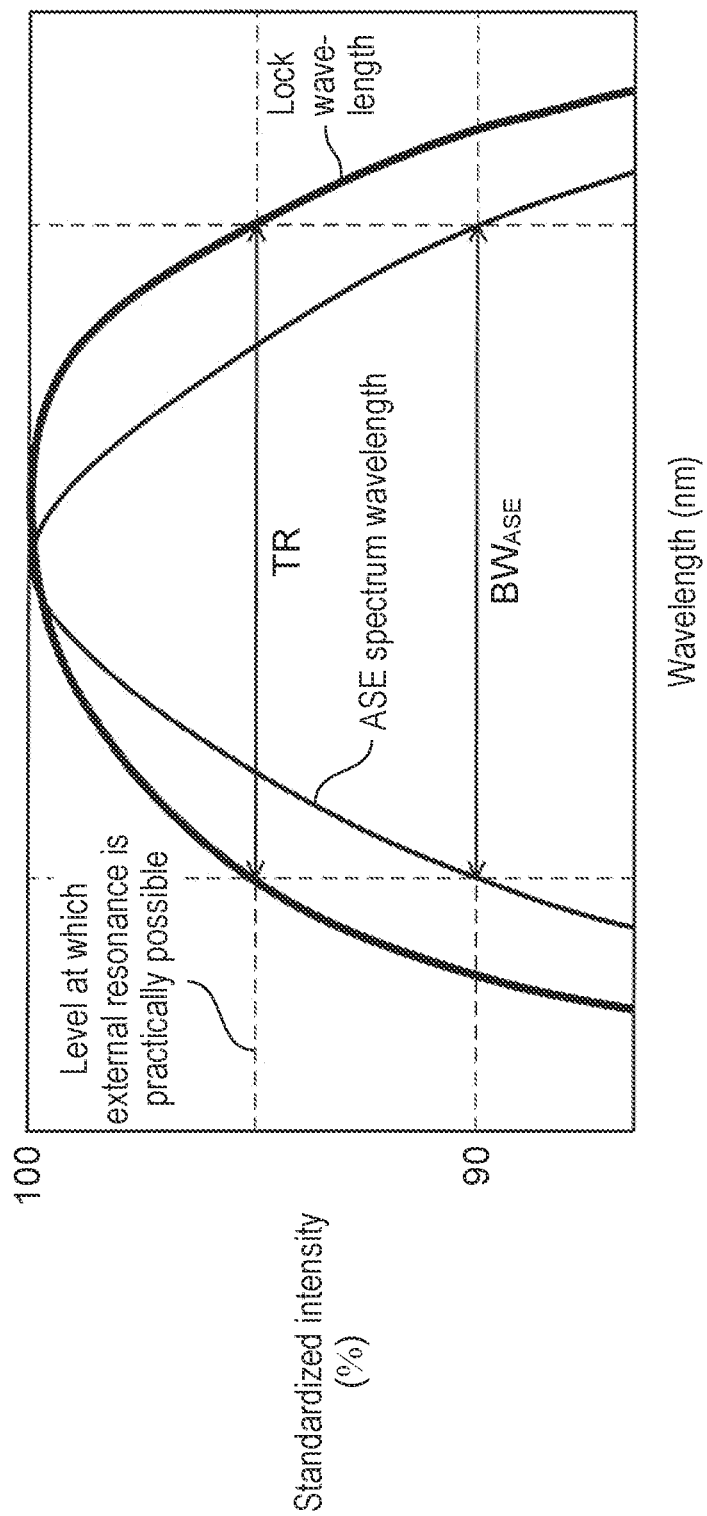
FIG. 16 is a view illustrating a relationship between a lock wavelength and an ASE bandwidth.

FIG. 16 is a view illustrating a relationship between a tuning range of the lock wavelength and the ASE bandwidth. It illustrates, at the same emitter of the lock wavelength, a standardized intensity of the external resonance oscillation when the lock wavelength is changed by changing the angle of the diffraction grating little by little. In the ASE spectrum and the tuning range of the lock wavelength, the peak wavelengths are generally slightly different, but in FIG. 16, the wavelength bandwidths are aligned for convenience. TR in the figure is a range in which the LD bar can oscillate practically by the external resonance, and a standardized intensity of 90% or more is desirable and 95% or more is more preferable. The term "practical" as used herein refers to an external resonance state that is desirable to be satisfied at the initial stage in consideration of a change in output due to the change in a current value or a change in characteristics due to long-term use. It is known that the BWASE in the figure has a bandwidth of a slice level SL=0.9 of the ASE spectrum, and roughly matches the tuning range of the lock wavelength in which the external resonance can be made.

In the present Exemplary Embodiment, it is proposed to specify a configuration of LD bar 100 and WBC system 10 according to the above-mentioned condition 1, condition 2, or condition 3. As a result, the external resonance oscillation can be made at all the emitters in LD bar 100.

When the configuration and method of Exemplary Embodiment 1 are adopted, it becomes easy to satisfy condition 1, condition 2, or condition 3. That is, when Exemplary Embodiment 1 and Exemplary Embodiment 2 are combined, WBC system 10 with improved oscillation performance can be realized more easily.

However, the present Exemplary Embodiment may be carried out without being combined with Exemplary Embodiment 1.

The above-described exemplary embodiments are merely examples of embodiment in carrying out the present disclosure, and these shall not limit the technical scope of the present disclosure. That is, the present disclosure can be implemented in various forms without departing from its gist or its main features.

According to the present disclosure, the oscillation performance of the wavelength beam combining system can be improved.

A wavelength beam combining system of the present disclosure and a method for manufacturing a laser diode bar array are suitable as techniques for improving the oscillation performance of the wavelength beam combining system.

What is claimed is:

1. A wavelength beam combining system that combines a plurality of beams with different wavelengths at one point, the system comprising:
   a laser diode bar array in which a plurality of laser diode bars having a plurality of emitters are arranged;
   a diffraction grating that diffracts a plurality of beams emitted from the laser diode bar array; and
   an external resonance mirror that feeds a part of the beams diffracted by the diffraction grating back into the laser diode bar array to make the part of the beams externally resonate, and
   wherein in the laser diode bar array, a main axis direction of an off-angle of at least one laser diode bar is reversed with respect to a main axis direction of an off-angle of another laser diode bar among the plurality of laser diode bars.

2. The wavelength beam combining system of claim 1, wherein in an emitter arrangement direction in the laser diode bar,
   positive/negative of an inclination of increase/decrease in a lock wavelength and positive/negative of an inclination of increase/decrease in an amplified spontaneous emission (ASE) wavelength are in a same direction, an absolute value of the inclination of increase/decrease in the ASE wavelength is smaller than an absolute value of the inclination of increase/decrease in the lock wavelength, and an equation, $|\Delta\lambda_{EC\_bar}| - |\Delta\lambda_{ASE\_bar}| \leq BW_{ASE\_bar}$ is established, where $\Delta\lambda_{EC\_bar}$ is an amount of change in the lock wavelength in the laser diode bar, $\Delta\lambda_{ASE\_bar}$ is an amount of change in an ASE peak wavelength in the laser diode bar, and $BW_{ASE\_bar}$ is an average value or a median value of ASE bandwidths of each of the emitters in the laser diode bar.

3. The wavelength beam combining system of claim 1, wherein in an emitter arrangement direction in the laser diode bar, positive/negative of an inclination of increase/decrease in a lock wavelength and positive/negative of an inclination of increase/decrease in an amplified spontaneous emission (ASE) wavelength are in a same direction, an absolute value of the inclination of increase/decrease in the lock wavelength is smaller than an absolute value of the inclination of increase/decrease in the ASE wavelength, and an equation, $|\Delta\lambda_{ASE\_bar}| - |\Delta\lambda_{EC\_bar}| \leq BW_{ASE\_bar}$ is established, where $\Delta\lambda_{ASE\_bar}$ is an amount of change in an ASE peak wavelength in the laser diode bar, $\Delta\lambda_{EC\_bar}$ is an amount of change in the lock wavelength in the laser diode bar, and $BW_{ASE\_bar}$ is an average value or a median value of ASE bandwidths of each of the emitters in the laser diode bar.

4. The wavelength beam combining system of claim 1, wherein in an emitter arrangement direction in the laser diode bar, positive/negative of an inclination of increase/decrease in a lock wavelength and positive/negative of an inclination of increase/decrease in an amplified spontaneous emission (ASE) wavelength are in opposite directions, and an equation, $|\Delta\lambda_{EC\_bar}| + |\Delta\lambda_{ASE\_bar}| \leq BW_{ASE\_bar}$ is established, where $\Delta\lambda_{EC\_bar}$ is an amount of change in the lock wavelength in the laser diode bar, $\Delta\lambda_{ASE\_bar}$ is an amount of change in an ASE peak wavelength in the laser diode bar, and $BW_{ASE\_bar}$ is an average value or a median value of ASE bandwidths of each of the emitters in the laser diode bar.

5. A method for manufacturing a laser diode bar array used in a wavelength beam combining system, the method comprising:

forming a semiconductor laser lamination structure including a light emitting layer on a wafer;

forming an emitter portion, a P-side electrode, and an N-side electrode on the wafer;

cutting out a plurality of multi-emitter laser diode bars from the wafer; and creating a laser diode bar array by combining the plurality of multi-emitter laser diode bars in which the laser diode bar array is created by reversing a main axis of an off-angle of at least one or more multi-emitter laser diode bars.

6. The method for manufacturing a laser diode bar array of claim 5, the wafer is made of a GaN board.

* * * * *